United States Patent
Bentley et al.

(10) Patent No.: US 9,477,552 B1
(45) Date of Patent: Oct. 25, 2016

(54) PRIORITY-BASED DECODING

(71) Applicant: International Business Machines Corporation, Armonk, NY (US)

(72) Inventors: Steven R. Bentley, Tucson, AZ (US); Roy D. Cideciyan, Rueschlikon (CH); Simeon Furrer, Altdorf (CH); Keisuke Tanaka, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/946,726

(22) Filed: Nov. 19, 2015

(51) Int. Cl.
*H03M 13/00* (2006.01)
*G06F 11/10* (2006.01)
*H03M 13/37* (2006.01)
*G11B 5/008* (2006.01)
*G11B 20/18* (2006.01)

(52) U.S. Cl.
CPC ....... *G06F 11/1076* (2013.01); *G11B 5/00813* (2013.01); *G11B 20/1833* (2013.01); *H03M 13/373* (2013.01)

(58) Field of Classification Search
CPC ......... H03M 13/1515; H03M 13/153; H03M 13/1535; H03M 13/154; H03M 13/1545; H03M 13/159
See application file for complete search history.

(56) References Cited

U.S. PATENT DOCUMENTS

| 6,446,236 B1 | 9/2002 | McEwen et al. |
| 7,395,491 B2 * | 7/2008 | Chen .................. H03M 13/293 714/755 |
| 8,196,001 B2 | 6/2012 | Chen et al. |
| 2010/0031127 A1 * | 2/2010 | Panteleev ......... H03M 13/1515 714/784 |

OTHER PUBLICATIONS

Al-Shahrani et al., "An Efficient Multiple-Errors and Multiple-Erasures Decoding Algorithm for Multitrack Magnetic Recording Channels," Proceedings of the International Conference on Information Technology: Computers and Communications, IEEE, Apr. 28-30, 2003, 5 pages.

* cited by examiner

*Primary Examiner* — Guy Lamarre
(74) *Attorney, Agent, or Firm* — Zilka-Kotab, PC

(57) ABSTRACT

In one embodiment, a tape drive includes a magnetic head having a plurality of read sensors, each read sensor being configured to read data simultaneously. The tape drive also includes a controller and logic integrated with and/or executable by the controller. The logic is configured to receive encoded data read from a plurality of tracks of a magnetic tape medium simultaneously. The logic is also configured to perform priority-based decoding on the encoded data based on erasure coefficients associated with at least one codeword of the encoded data. In another embodiment, a controller-implemented method includes receiving encoded data read from a plurality of tracks of a magnetic tape medium simultaneously and performing priority-based decoding on the encoded data based on erasure coefficients associated with at least one codeword of the encoded data.

24 Claims, 11 Drawing Sheets

PRIORITY-BASED DECODING

BACKGROUND

The present invention relates to tape storage systems, and more specifically, to error-and-erasure decoding based on priority.

Currently-used linear tape drives apply product codes for error-correction coding (ECC). These product codes contain two Reed-Solomon component codes consisting of a C1 row code and a C2 column code. Failure to decode a product codeword, which requires successful decoding of all C1 rows and all C2 columns within a product code, leads to a temporary and/or permanent error. These temporary or permanent errors are a significant problem when attempting to store data to tape.

Typically, current tape drives implement ECC with two modes of operation: 1) Error-only decoding (decoding in which no information about uncorrectable C1 codewords is passed to the C2 decoder); and 2) Erasure-decoding (decoding in which information about C1 uncorrectable codewords are passed from the C1 decoder to the C2 decoder).

The second mode, erasure-decoding, is beneficial in the case where C1 uncorrectable codewords having a large number of byte errors are used as erasure pointers for C2 decoding. Conversely, the second mode likely leads to performance degradation in the case where C1 uncorrectables with only a small number of errors (only slightly beyond the error correction capability of the C1 decoder) are used as erasure pointers for C2 decoding. Therefore, it is not always beneficial to utilize erasure-decoding when implementing ECC in tape drives.

SUMMARY

In one embodiment, a tape drive includes a magnetic head having a plurality of read sensors, each read sensor being configured to read data simultaneously. The tape drive also includes a controller and logic integrated with and/or executable by the controller. The logic is configured to receive encoded data read from a plurality of tracks of a magnetic tape medium simultaneously. The logic is also configured to perform priority-based decoding on the encoded data based on erasure coefficients associated with at least one codeword of the encoded data.

In another embodiment, a controller-implemented method includes receiving encoded data read from a plurality of tracks of a magnetic tape medium simultaneously and performing priority-based decoding on the encoded data based on erasure coefficients associated with at least one codeword of the encoded data.

In yet another embodiment, a computer program product includes a computer readable storage medium having program instructions embodied therewith. The embodied program instructions are executable by a controller to cause the controller to receive, by the controller, encoded data read from a plurality of tracks of a magnetic tape medium simultaneously. The embodied program instructions are also executable by the controller to cause the controller to perform, by the controller, priority-based decoding on the encoded data based on erasure coefficients associated with at least one codeword of the encoded data.

Other aspects and embodiments of the present invention will become apparent from the following detailed description, which, when taken in conjunction with the drawings, illustrate by way of example the principles of the invention.

DETAILED DESCRIPTION

Figure 1:
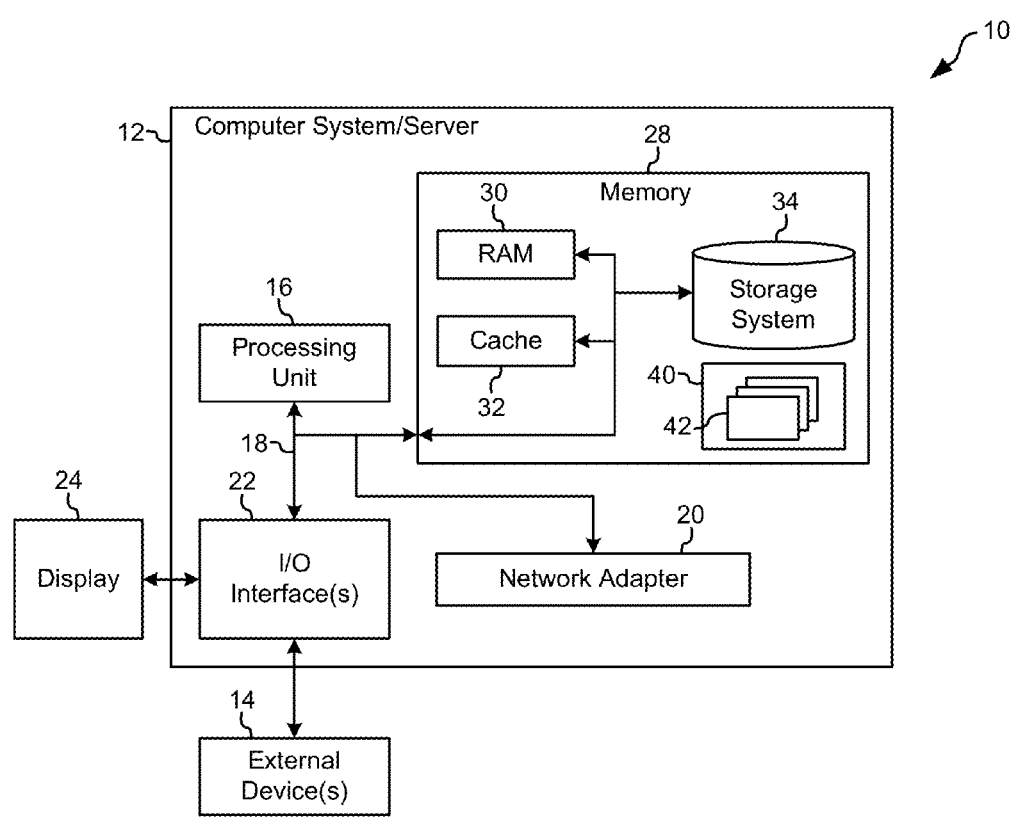
FIG. 1 illustrates a network storage system, according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The term "about" as used herein indicates the value preceded by the term "about," along with any values reasonably close to the value preceded by the term "about," as would be understood by one of skill in the art. When not indicated otherwise, the term "about" denotes the value preceded by the term "about"±10% of the value. For example, "about 10" indicates all values from and including 9.0 to 11.0.

The following description discloses several preferred embodiments of systems, methods, and computer program products for a priority-based decoding scheme that utilizes track-dependent erasure coefficients for erasure pointers in C2 decoding. The coefficients represent a likelihood that the corresponding C1 bytes are treated as erasures in C2 decoding.

The erasure coefficients in a C1 codeword are independent of one another, and therefore may all be different. For example, in the case of a time-varying signal-to-noise ratio (SNR) over the course of a C1 codeword, the erasure coefficients may be determined from the SNR which may significantly vary over the C1 codeword as written on tracks of the magnetic tape. The erasure coefficient for a particular byte may also be determined from a single run-length limited (RLL) decoding failure. Again, in this case, e.g., in response to a rate 16/17 RLL code being used, a RLL decoding failure indicates that one or two bytes at the RLL decoder are in error. This results in a high erasure coefficient for these two bytes at the output of the RLL decoder.

These erasure pointers and track-dependent erasure coefficients, in one embodiment, are used by a priority-based C2 decoder to perform error-and-erasure decoding that depends on all the erasure pointers in a C2 codeword. This scheme adapts to the channel as observed by the C2 decoder, in order to improve decoding performance. The C2 decoding algorithm is adapted to the number and type of erasure pointers in a C2 codeword and thereby provides improved error rate performance in the presence of both random errors and temporary/permanent burst errors on tape tracks at the expense of a moderate increase in implementation complexity.

In one general embodiment, a tape drive includes a magnetic head having a plurality of read sensors, each read sensor being configured to read data simultaneously. The tape drive also includes a controller and logic integrated with and/or executable by the controller. The logic is configured to receive encoded data read from a plurality of tracks of a magnetic tape medium simultaneously. The logic is also configured to perform priority-based decoding on the encoded data based on erasure coefficients associated with at least one codeword of the encoded data.

In another general embodiment, a controller-implemented method includes receiving encoded data read from a plurality of tracks of a magnetic tape medium simultaneously and performing priority-based decoding on the encoded data based on erasure coefficients associated with at least one codeword of the encoded data.

In yet another general embodiment, a computer program product includes a computer readable storage medium having program instructions embodied therewith. The embodied program instructions are executable by a controller to cause the controller to receive, by the controller, encoded data read from a plurality of tracks of a magnetic tape medium simultaneously. The embodied program instructions are also executable by the controller to cause the controller to perform, by the controller, priority-based decoding on the encoded data based on erasure coefficients associated with at least one codeword of the encoded data.

Referring now to FIG. 1, a schematic of a network storage system 10 is shown according to one embodiment. This network storage system 10 is only one example of a suitable storage system and is not intended to suggest any limitation as to the scope of use or functionality of embodiments of the invention described herein. Regardless, network storage system 10 is capable of being implemented and/or performing any of the functionality set forth hereinabove.

In the network storage system 10, there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in the network storage system 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 may include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 may be provided for reading from and writing to a non-removable, non-volatile magnetic media—not shown and typically called a "hard disk," which may be operated in a HDD. Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media may be provided. In such instances, each may be connected to bus 18 by one or more data media interfaces. As will be further depicted and described below, memory 28 may include at least one program product having a set (e.g., at least one) of program modules that are configured to carry out the functions of embodiments described herein.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication may occur via Input/Output (I/O) interfaces 22. Still yet, computer system/server 12 may communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, redundant array of independent disks (RAID) systems, tape drives, and data archival storage systems, etc.

Figure 2A:
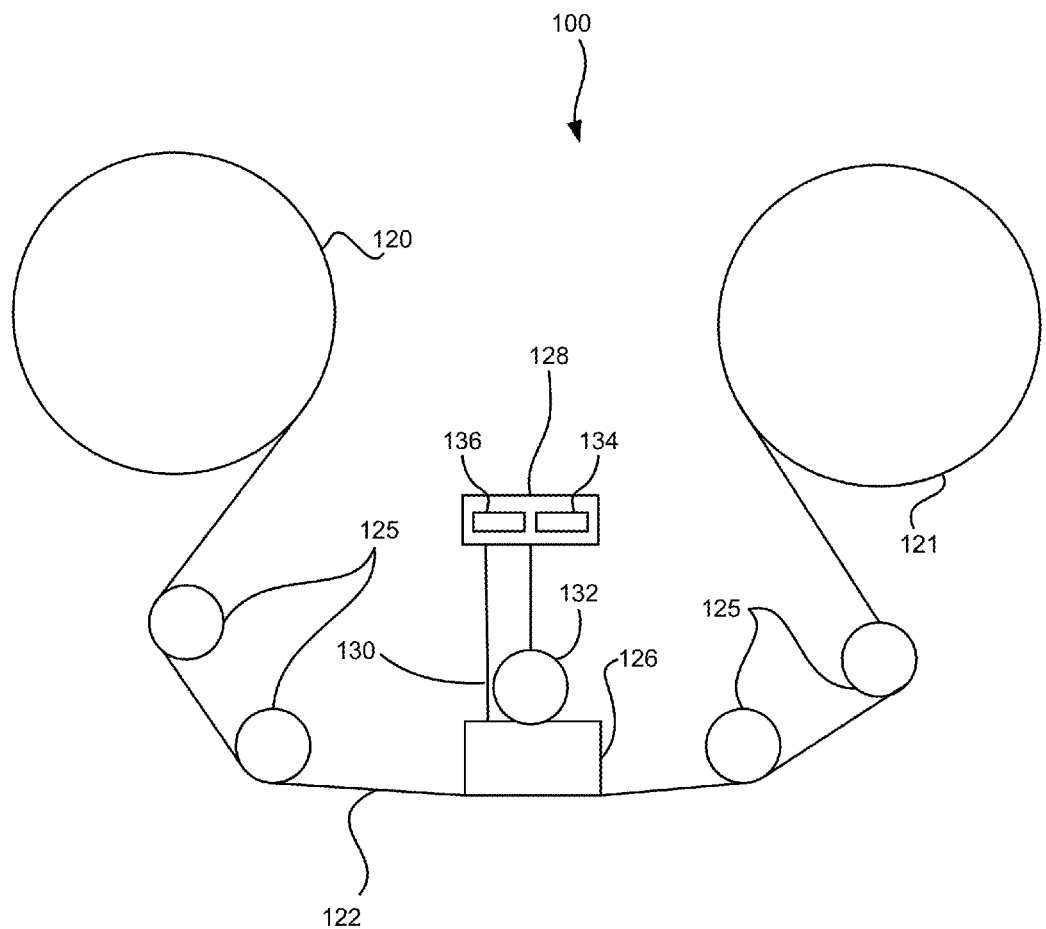
FIG. 2A illustrates a simplified tape drive of a tape-based data storage system, according to one embodiment.

FIG. 2A illustrates a simplified tape drive 100 of a tape-based data storage system, which may be employed in the context of the present invention. While one specific implementation of a tape drive is shown in FIG. 2A, it should be noted that the embodiments described herein may be implemented in the context of any type of tape drive system.

As shown, a tape supply cartridge 120 and a take-up reel 121 are provided to support a tape 122. One or more of the reels may form part of a removable cartridge and are not necessarily part of the tape drive 100. The tape drive, such as that illustrated in FIG. 2A, may further include drive motor(s) to drive the tape supply cartridge 120 and the take-up reel 121 to move the tape 122 over a tape head 126 of any type. Such head may include an array of readers, writers, or both.

Guides 125 guide the tape 122 across the tape head 126. Such tape head 126 is in turn coupled to a controller 128 via a cable 130. The controller 128, may be or include a processor and/or any logic for controlling any subsystem of the tape drive 100. For example, the controller 128 typically controls head functions such as servo following, data writing, data reading, etc. The controller 128 may include at least one servo channel and at least one data channel, each of which include data flow processing logic configured to process and/or store information to be written to and/or read from the tape 122. The controller 128 may operate under logic known in the art, as well as any logic disclosed herein, and thus may be considered as a processor for any of the descriptions of tape drives included herein, in various embodiments. The controller 128 may be coupled to a memory 136 of any known type, which may store instructions executable by the controller 128. Moreover, the controller 128 may be configured and/or programmable to perform or control some or all of the methodology presented herein. Thus, the controller 128 may be considered to be configured to perform various operations by way of logic programmed into one or more chips, modules, and/or blocks; software, firmware, and/or other instructions being available to one or more processors; etc., and combinations thereof.

The cable 130 may include read/write circuits to transmit data to the head 126 to be recorded on the tape 122 and to receive data read by the head 126 from the tape 122. An actuator 132 controls position of the head 126 relative to the tape 122.

An interface 134 may also be provided for communication between the tape drive 100 and a host (internal or external) to send and receive the data and for controlling the operation of the tape drive 100 and communicating the status of the tape drive 100 to the host, all as will be understood by those of skill in the art.

Figure 2B:
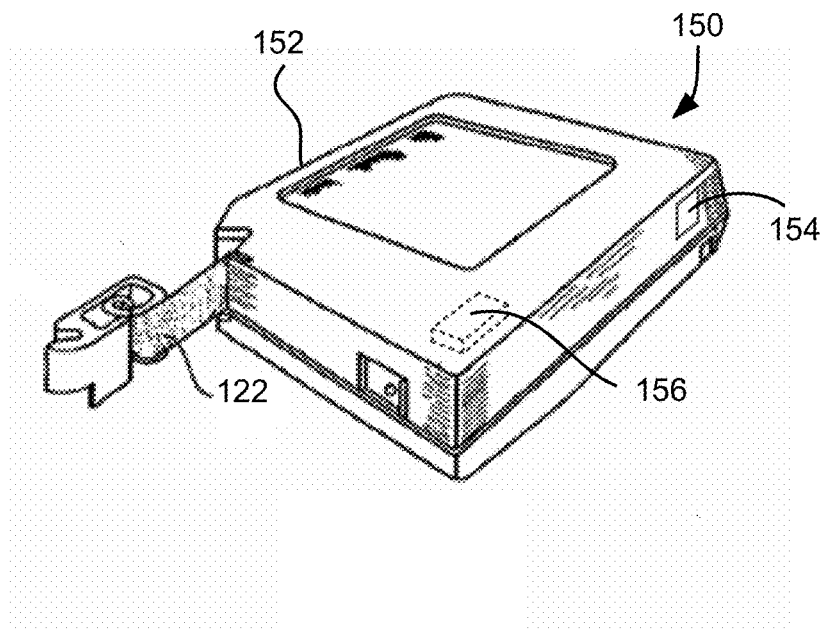
FIG. 2B is a schematic diagram of a tape cartridge according to one embodiment.

FIG. 2B illustrates an exemplary tape cartridge 150 according to one embodiment. Such tape cartridge 150 may be used with a system such as that shown in FIG. 2A. As shown, the tape cartridge 150 includes a housing 152, a tape 122 in the housing 152, and a nonvolatile memory 156 coupled to the housing 152. In some approaches, the nonvolatile memory 156 may be embedded inside the housing 152, as shown in FIG. 2B. In more approaches, the nonvolatile memory 156 may be attached to the inside or outside of the housing 152 without modification of the housing 152. For example, the nonvolatile memory may be embedded in a self-adhesive label 154. In one preferred embodiment, the nonvolatile memory 156 may be a Flash memory device, ROM device, etc., embedded into or coupled to the inside or outside of the tape cartridge 150. The nonvolatile memory is accessible by the tape drive and the tape operating software (the driver software), and/or other device.

Figure 3:
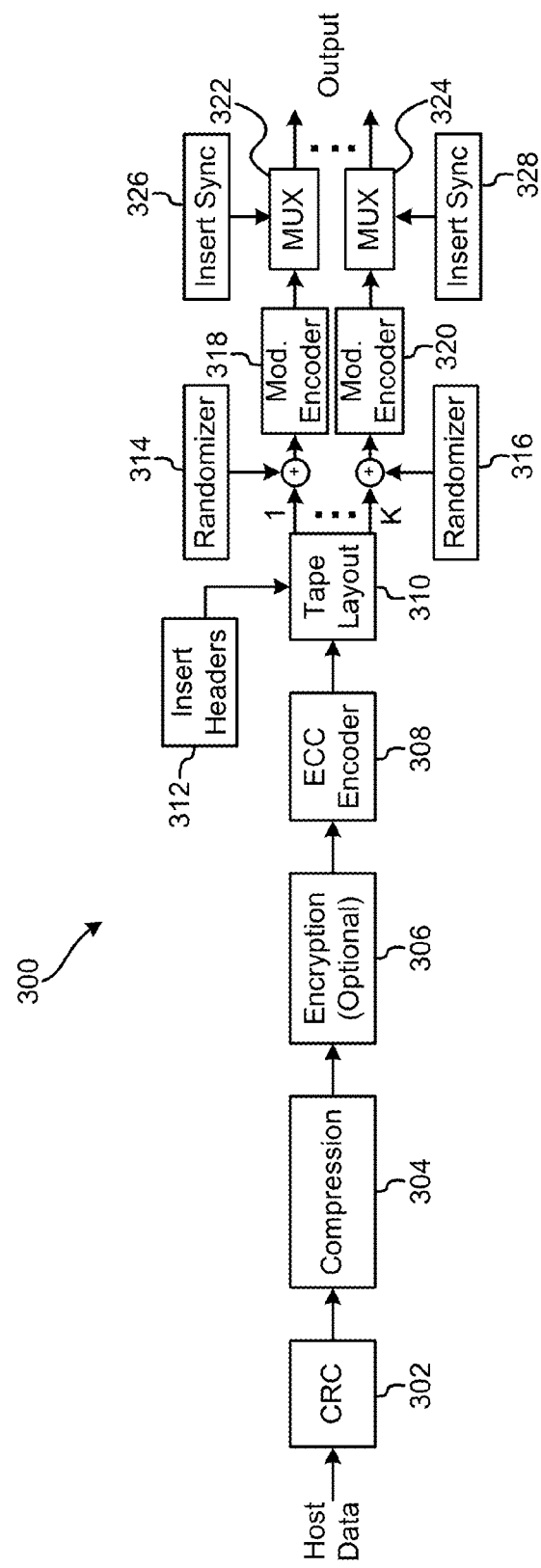
FIG. 3 illustrates a conceptual data flow in a tape drive in accordance with one embodiment.

FIG. 3 shows, in detailed form, a conceptual data flow 300 in a tape drive with K simultaneously written tracks via K write channels. The data flow 300 includes passing host data through a cyclic redundancy check (CRC) error detection encoder 302, a compression module 304, an optional encryption module 306, an error correction code (ECC) encoder 308 (which includes a C1 encoder and a C2 encoder, arranged as C1/C2, or C2/C1), and a tape layout module 310, according to one embodiment. The header insertion module 312 may be positioned as shown, feeding into the tape layout module 310, or may be positioned feeding into the ECC encoder 308, thereby allowing the headers to receive some amount of ECC encoding, in one embodiment. The tape layout module 310 splits the data into individual feeds for each channel 1, . . . , K to write to the tracks of the tape medium. The data flow 300 also includes scrambling the data (data randomization) 314, . . . , 316, modulation encoding 318, . . . , 320, synchronization insertion 326, . . . , 328, and multiplexing 322, . . . , 324 for each simultaneously written track 1, . . . , K.

In the following descriptions, most of these operations are not shown, in order to simplify descriptions. However, any of the descriptions herein may include additional operations not depicted, as would be understood by one of ordinary skill in the art upon reading the present descriptions. The number of tracks that may be written simultaneously depends on the tape drive being used, with the value of K ranging from 1 to 64 or more.

Figure 4:
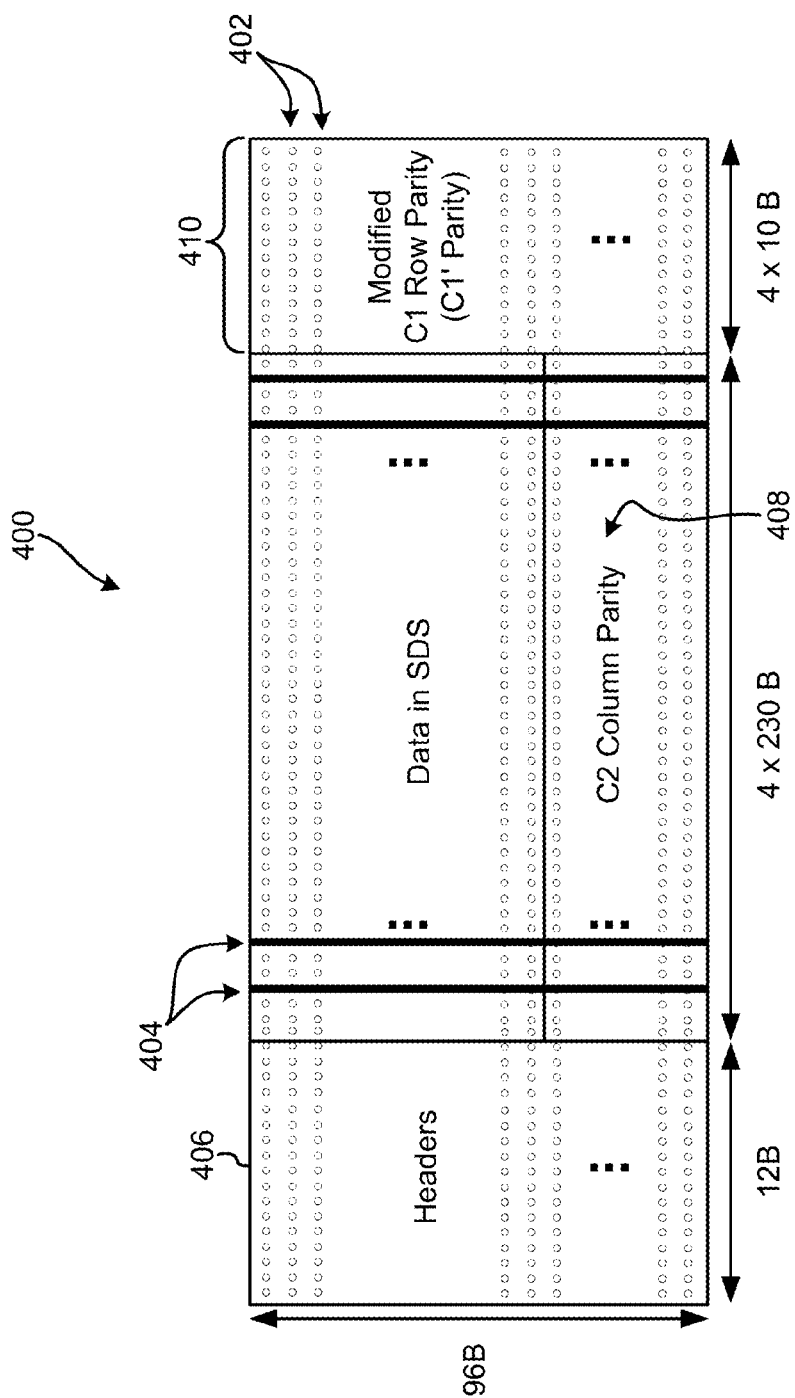
FIG. 4 shows a logical data array that may be used to organize data in a sub data set (SDS), according to one embodiment.

FIG. 4 shows a logical data array 400 that may be used to organize data in a sub data set (SDS), according to one embodiment. As shown, the data array includes a plurality of rows 402 and columns 404. Each row 402 in the data array 400 is a codeword interleave (CWI) that includes a plurality of C1 codewords. When the CWI includes four interleaved codewords, it is referred to as a CWI-4. The data in the SDS is protected by C1 encoding across each row 402 to produce C1 row parity (not shown as it is modified later to produce the data array 400), and by C2 encoding across each column 404 to produce C2 column parity 408.

As shown, the headers 406 for each row 402 may be encoded using a C1 encoding scheme by modifying the C1 parity (computed for the data in the row 402 only) to account for the headers 406 to produce C1' parity 410. In this embodiment, the headers 406 are protected by one-level ECC (C1' parity 410 only), whereas the data is protected by two-level ECC (C1' parity 410 and C2 parity 408).

Each data set includes multiple sub data sets and each sub data set may be represented by a logical two-dimensional array. Usually hundreds of headers are assigned to a single data set because each data set includes multiple SDSs and each row (CWI) of a column-encoded SDS is assigned a header.

Currently-used linear tape drives simultaneously write and read up to 32 tracks to and/or from a magnetic tape medium. C1 row codewords of a product code are written in a byte-interleaved fashion onto individual tracks of the magnetic tape medium. Due to differences in performance of the individual transducers writing and reading the parallel tracks of the magnetic tape medium, the raw error-rate of individual tracks may vary significantly from track to track, and across time for each individual track.

In order to address this variability of the raw error-rate of individual tracks, a track-dependent decoding scheme may be used, according to one embodiment that is configured to adapt to the time-varying signal quality of all tracks read simultaneously from the magnetic tape medium.

In a further embodiment, erasure pointers (that signal that a C1 codeword should be erased, instead of relying on the decoded bytes therein during C2 decoding) are generated in a manner that accounts for the track signal quality. In one approach, erasure pointers for C2 decoding are enabled if, and only if, C1 codewords include a large number of byte errors with a relatively high probability. Each erasure pointer may have a coefficient associated therewith, the coefficient indicating a belief/likelihood/probability that the C2 decoder should treat the corresponding C1 bytes as erasures, and not rely on the decoded information therein.

Figure 5:
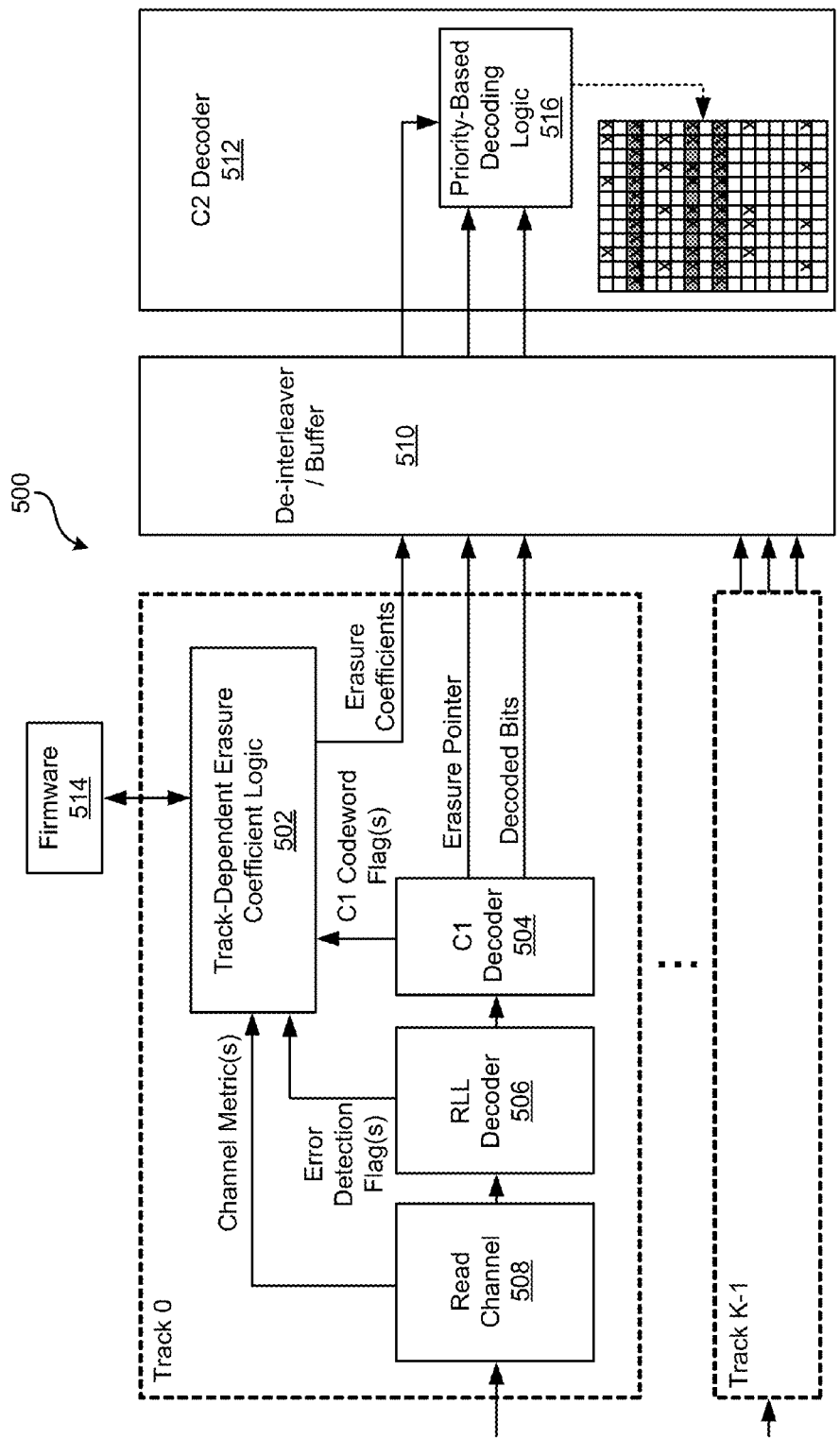
FIG. 5 shows a system having track-dependent erasure coefficient logic, according to one embodiment.

Now referring to FIG. 5, a system 500 configured for priority-based decoding is shown according to one embodiment. As shown, the system 500 includes, for each of K tracks (Track 0, Track 1, . . . , Track K−1), read channel architecture 508, a RLL decoder 506 (or some other suitable decoder of a type known in the art), a C1 decoder 504, and track-dependent erasure coefficient logic 502. These various components may be included in each track, or some or all of the various components may be centralized and implemented for each track from a central implementation thereof.

The track-dependent erasure coefficient logic 502 may use side information about the reliability of detected bytes within C1 codewords of each track to determine the probability that a C1 codeword has a number of byte errors that exceeds a predetermined threshold. In this embodiment, erasure pointers for C2 decoding are utilized if and only if there is a high probability that one or more C1 codewords in a specific track contain a large number of byte errors. By a large number of byte errors, what is meant is that the number of byte errors exceeds the amount of correctable byte errors within a single C1 codeword. The probability of an amount by which the number of byte errors within a single C1 codeword exceeds the maximum number of correctable byte errors is indicated with erasure coefficients $w_i$, e.g., $w_0$, $w_1$, $w_2$, for each erasure pointer. This decision as to what the likelihood or probability of the amount by which the number of byte errors within a single C1 codeword exceeds the maximum number of correctable byte errors may be based on side information. This side information provides insight into the reliability of the detected bytes within the C1 codewords for each track, Track 0 to Track K−1.

Each erasure coefficient is associated with an erasure flag for C2 decoding indicated by the C1 decoder, with the erasure coefficient, $w_i$, being in a range from 0 to 1, e.g., ($0 \leq w_i \leq 1$). The erasure coefficient may correlate with the number of byte errors within a C1 codeword, thus representing a belief/likelihood/probability that the C2 decoder should treat the corresponding C1 bytes as erasures, and not rely on the decoded information therein.

Each erasure coefficient may be selected such that it correlates with the number of byte errors within a C1 codeword. This is, for example, the case when the side information about erasure coefficients is obtained from the number of RLL decoding failures within a C1 codeword. A high number of RLL decoding failures within a C1 codeword indicates a high number of actual byte errors within a C1 codeword. In this case all erasure coefficients in a C1 codeword may have the same value and they are approximately proportional to the number of byte errors in a C1 codeword. However, erasure coefficients may also be obtained in other ways, such as from SNR, mean squared error (MSE) measurements, a single RLL decoding failure, etc., in which case the erasure coefficients of each byte in a C1 codeword may be different and reflect the probability that a particular byte may be in error.

The computation of the erasure coefficients in the track-dependent erasure coefficient logic 502 may utilize side information about the reliability of detected bytes within C1 codewords of each track. Any potential source of side information may be used, such as statistics of channel/track performance that may be monitored by the firmware 514, e.g., calibration data, runtime statistics, etc.; C1 decoder 504 statistics, e.g., a number of C1 uncorrectable codewords after C1 decoding; read channel 508 metrics, e.g., MSE, SNR, etc.; RLL decoder 506 metrics, e.g., a number of error detection flag(s), etc. Of course, other sources of side information may be used as would be apparent to one of skill in the art upon reading the present descriptions.

In one embodiment, the erasure coefficients may be used in a determination to enable erasure decoding on a per decoded C1 codeword basis. Any erased C1 row codeword bytes may then be used as erasures during C2 error-and-erasure column codeword decoding. Once the erasure coefficients, $w_i$, of all bytes in a decoded C1 row codeword are computed and/or estimated, there will be N1 erasure coefficients in the C1 row codeword, one for each byte in the codeword.

These erasure coefficients may be summed over all N1 decoded bytes of the C1 codeword (note: a C1 codeword has N1 bytes) to obtain the sum S, where $S = \Sigma_1^{N1} w_i$. In response to a determination that this sum S is greater than a predetermined configurable threshold, all the N1 bytes of the C1 codeword may be erased (e.g., the erase pointer is enabled for the decoded C1 codeword which is then used to erase a row of decoded C1 bytes during C2 error-and-erasure column decoding).

The predetermined configurable threshold may have any positive value, such as 0.1, 0.2, 0.25, 0.5, 0.6, 0.75, 1.0, 2.0, 5.0, 10.0, etc., determined based on a desired amount of errors in a codeword that causes an erasure pointer to be set and a value of a typical erasure coefficient $w_i$.

In one embodiment, K=32, e.g., there may be 32 tracks in the system 500. In some other embodiments, K may equal 16, 64, or some other positive integer.

After the erasure pointers are either enabled and set, or disabled and not used, the C1 codewords, or the erasure-enabled C1 codewords (with at least one C1 codeword having an erasure pointer enabled) are passed to a de-interleaver/buffer 510 to revert the interleaving of the data in the encoded data and to store the data prior to passing the data to the C2 decoder 512 for C2 decoding thereof. The C2 decoding may be error-only decoding (in response to the erasure pointers not being enabled) or error-and-erasure decoding (in response to the erasure pointers being enabled, as shown in FIG. 5 by the darkened rows of the array in the C2 decoder 512).

In one embodiment, the track-dependent erasure coefficient logic 502 may be in communication with firmware 514 of a tape drive, a tape library, or some other suitable system capable of directing the track-dependent erasure coefficient logic 502 before/during/after erasure enabling procedures.

Track-dependent erasure coefficient logic 502 is configured to compute erasure coefficients, $w_i$, with ($0.0 \leq w_i \leq 1.0$) for each individual erasure pointer for C2 decoding. The erasure coefficients, $w_i$, may correlate with the number of byte errors within C1 codewords, thus representing a probability and/or belief and/or likelihood that the C2 decoder 512 should treat the corresponding C1 bytes as erasures. In this approach, each erasure coefficient, reflects a probability that a particular byte in a C1 codeword is in error.

Therefore, these coefficients may be used to determine a priority for C2 decoding performing an error-and-erasure decoding algorithm that depends on all the erasure pointers and erasure coefficients that are placed in a C2 codeword.

In one embodiment, the track-dependent erasure coefficient logic 502 is configured to create an erasure coefficient list, W, that includes the individual erasure coefficients, $w_i$, associated with all symbols in a C1 codeword (and therefore in all C2 codewords).

The C1 decoder 504 and C2 decoder 512 are each configured to utilize either a RS(N,K) code with minimum Hamming distance $d_{min}=N-K+1$ or a block code with minimum Hamming distance $d_{min}$. For example, the code may be the C2 column code in a product code.

An erasure coefficient list, W, may be constructed according to one embodiment by the track-dependent erasure coefficient logic 502. The erasure coefficient list, W, includes N coefficients that are arranged in a monotonically increasing arrangement, e.g., $W=\{w_1, w_2, w_3, \ldots, w_N\}$, where $0.0 \leq w_i \leq 1.0$ and $w_i \leq w_{i+1}$. In a further approach, the coefficients $w_i$ may be q-level quantized, but this is not necessary in all embodiments.

In the erasure coefficient list, W, according to one embodiment, an erasure coefficient of zero, e.g., $w_i=0$, corresponds to a case where no erasure pointer is being raised, e.g., a corresponding symbol is obtained from successful C1 decoding in a previous decoding step. A second erasure coefficient list W' is obtained from the initial erasure coefficient list, W, by removing all erasure coefficients having a value of zero, e.g., removing all $w_i=0$. In response to there being several coefficients in the second erasure coefficient list W' that are equal to max {W'}, one coefficient may be picked arbitrarily such that $w_i$=max {W'}, and the processing may continue in the loop until the number of erasures per codeword, E, is equal to an adaptive limit to a number of erased symbols, L, e.g., |E|=L, or |W'|=0.

In one embodiment, an erasure coefficient having a value of 1, e.g., $w_i=1$, corresponds to a case where an erasure pointer is being raised without an associated symbol, and therefore must be erased in subsequent decoding, as no byte value is available with which to base decoding on.

A third erasure coefficient list $W''=\{w_j, w_{j+1}, w_{j+2}, \ldots, w_m\}$ is obtained from the erasure list W by excluding all the coefficients that are zero or one where $1 \leq j$ and $m \leq N$.

The priority-based decoding logic 516 of the C2 decoder 512 is configured to determine whether error-and-erasure decoding is to be used during C2 decoding of the codewords provided to the C2 decoder from the de-interleaver/buffer 510. This determination may be based on several factors, including, but not limited to, the erasure coefficient list W, the number of symbols to erase, L, the minimum Hamming distance $d_{min}$, the number of symbols in a codeword, N, and the minimum margin, M, reserved for correcting at least floor(M/2) symbols, as described in more detail later.

According to one embodiment, a tape drive may include a magnetic head having a plurality of read sensors. Each read sensor is configured to read data simultaneously from one track of a magnetic tape medium, thereby allowing a plurality of tracks to be read simultaneously from the magnetic tape medium, the number capable of being read simultaneously being equal to the number of read sensors of the magnetic head. Of course, some read sensors may be configured to read servo tracks for head alignment, and/or for other purposes, but for the sake of these descriptions, it is assumed that the read sensors are each capable of reading data from the magnetic tape medium.

The tape drive also includes a hardware processor and logic integrated with and/or executable by the hardware processor. The hardware processor may be a hardware processing unit and/or circuit, such as a central processing unit (CPU), an application specific integrated circuit (ASIC), a field programmable gate array (FPGA), etc., combinations thereof, or any other suitable computing device known in the art. The logic may be implemented in software, hardware, or some combination thereof. The logic is configured to read, using the plurality of read sensors, encoded data from a plurality of tracks of the magnetic tape medium simultaneously. The number of tracks that may be read simultaneously is determined by the number of read sensors of the magnetic head. The logic is also configured to perform track-dependent erasure decoding on the encoded data based on detection of one or more time-varying signal quality issues associated with at least one of the plurality of tracks read simultaneously from the magnetic tape medium, with priority-based decoding based on coefficients assigned to each erasure pointer.

Figure 6:
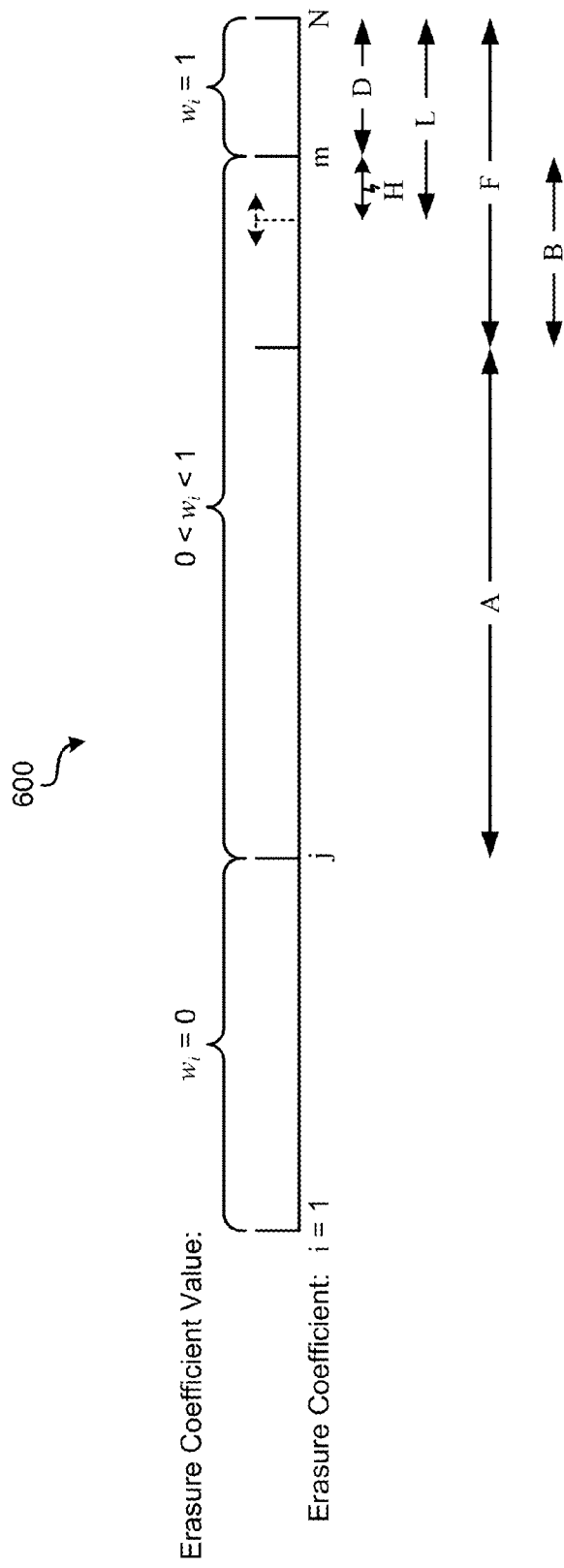
FIG. 6 shows organization of erasure coefficients for a codeword, according to one embodiment.

Now referring to FIG. 6, an erasure coefficient list W 600 is shown in which the coefficients, $w_i$, for each symbol in a codeword have been arranged according to their respective coefficient values, with coefficients of zero (indicating the associated symbol is not to be erased) on the left side, and coefficients of one (indicating the associated symbol is to be erased) on the right side, e.g., a monotonically increasing arrangement. Because each coefficient is associated with one symbol in the codeword, it may be assumed that these symbols are logically arranged along with the coefficients.

Using the erasure coefficient list W 600, the adaptive number of erased symbols, L, may be calculated based on the minimum Hamming distance, $d_{min}$, the length of the codeword, N, and the minimum margin, M, reserved for correcting at least floor(M/2) symbols.

Referring again to FIG. 6, according to one embodiment, the number of erased symbols, L, may be computed according to the following equation, L=D+H=D+floor((F−D)B/(A+B)), which may be notated as $L=f(d_{min},M,N,W)$.

The maximum number of erased symbols, F, is equal to $d_{min}-1-M$, and the term D is defined as D=min{F, N−m} where D is the total number of symbols in a C1 codeword that have erasure coefficient 1. We assumed that D is less than or equal to F. If D>F, then the decoder either declares decoding failure or attempts to correct F or more erased bytes by accepting the risk of higher probability of miscorrection. The maximum number of erased bytes that can be corrected is $F+M=d_{min}-1$. Furthermore, the sum of the terms A+B is the sum of the coefficients in the third erasure coefficient list W'' where the value of the coefficients are between 0 and 1, e.g., $0<w_i<1$, with $A+B=\Sum_{i=j}^{m}w_i$, with B being the sum of the coefficients in the area defined by F where the value of the coefficients are not equal to 1, e.g., $w_i \neq 1$, where $B=\Sum_{i=N-F+1}^{N-D}w_i$. The number of erased symbols, L, is adaptive, i.e., it depends on channel conditions, e.g., the erasure coefficients $w_i$, among other variables.

Figure 7:
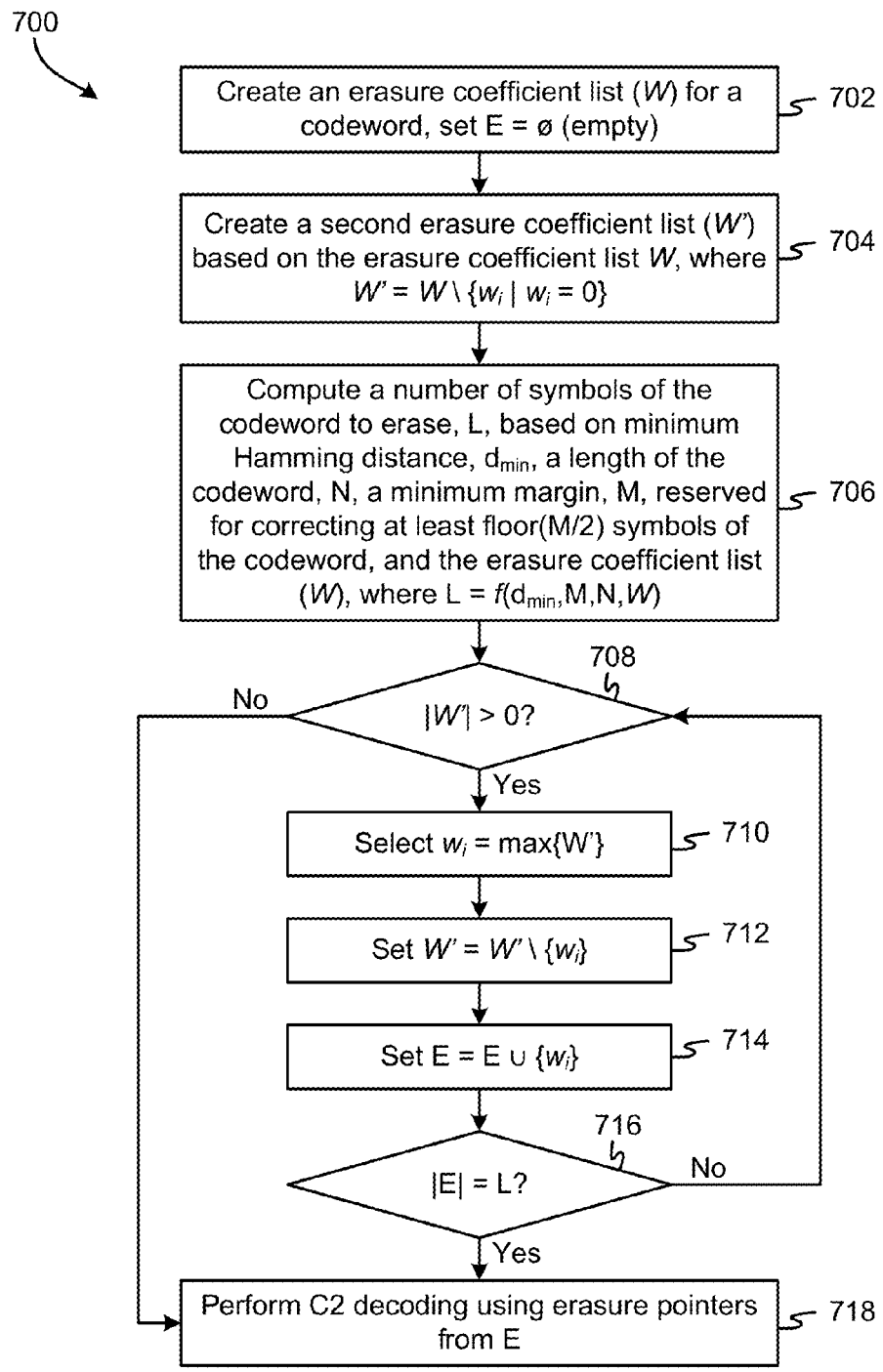
FIG. 7 shows a flowchart of a method, according to one embodiment.

Now referring to FIG. 7, a method 700 is shown according to one embodiment. The method 700 may be performed in accordance with the present invention in any of the environments depicted in FIGS. 1-6, among others, in various embodiments. Of course, more or less operations than those specifically described in FIG. 7 may be included in method 700, as would be understood by one of skill in the art upon reading the present descriptions.

Each of the steps of the method 700 may be performed by any suitable component of the operating environment. For example, in various embodiments, the method 700 may be partially or entirely performed by a controller, a processor, a tape drive, or some other device having one or more processors therein. The processor, e.g., processing circuit(s), chip(s), and/or module(s) implemented in hardware and/or software, and preferably having at least one hardware component, may be utilized in any device to perform one or more steps of the method 700. Illustrative processors include, but are not limited to, a CPU, an ASIC, a FPGA, etc., combinations thereof, or any other suitable computing device known in the art.

In method 700, W is the erasure list comprising the erasure coefficients corresponding to all symbols in a C2 codeword generated by track-dependent erasure coefficient logic, with a C2 code being a (N,K) RS code, |W|=N, W' is the second erasure list having of all nonzero coefficients from W, |W'|=number of coefficients in W', E is the erasure list of symbols to erase, |E|=number of entries in E, and M is the minimum margin reserved for correcting at least floor(M/2) symbols.

As shown in FIG. 7, method 700 may initiate with operation 702, where an erasure coefficient list, W, is created for a codeword. The erasure coefficient list includes all erasure coefficients for each decoded symbol in the codeword, each erasure coefficient being a measure of the reliability of the associated decoded symbol of the codeword. Also, the erasure list, E, is set to empty. This erasure list will be populated during the method 700.

In operation 704, a second erasure coefficient list, W', is created based on the erasure coefficient list, W. The second erasure coefficient list is equal to all erasure coefficients from the erasure coefficient list less any erasure coefficients equal to zero, e.g., $W'=W\setminus\{w_i|w_i=0\}$.

In operation 706, a number of symbols of the codeword to erase, L, is computed based on minimum Hamming distance, $d_{min}$, a length of the codeword, N, a minimum margin, M, reserved for correcting at least floor(M/2) symbols of the codeword, and the erasure coefficient list (W), where $L=f(d_{min},M,N,W)$.

In one embodiment, L=D+H=D+floor((F-D) B/(A+B)). The maximum number of erased symbols, F, is equal to $d_{min}-1-M$, and the term D is defined as D=min{F, N-m} where D is the total number of symbols in a C1 codeword that have erasure coefficient 1. We assumed that D is less than or equal to F. If D>F, then the decoder either declares decoding failure or attempts to correct F or more erased bytes by accepting the risk of higher probability of miscorrection. The maximum number of erased bytes that may be corrected is $F+M=d_{min}-1$. Furthermore, the sum of the terms A+B is the sum of the coefficients in the third erasure coefficient list W'' where the value of the coefficients are between 0 and 1, e.g., $0<w_i<1$, with $A+B=\Sum_{i=j}^{m}w_i$, with B being the sum of the coefficients in the area defined by F where the value of the coefficients are not equal to 1, e.g., $w_i \neq 1$, where $B=\Sum_{i=N-F+1}^{N-D}w_i$.

In operation 708, it is determined whether the number of erasure coefficients (and therefore a number of associated symbols) in the second erasure coefficient list is greater than zero, e.g., |W'|>0. In response to a determination that the number of erasure coefficients in the second erasure coefficient list is greater than zero, method 700 continues to operation 710; otherwise, method 700 jumps to operation 718.

In operation 710, an erasure coefficient having a maximum value is selected, e.g., $w_i$=max {W'}. In operation 712, the second erasure coefficient list has this erasure coefficient $w_i$ removed therefrom, e.g., $W'=W'\setminus\{w_i\}$. Then, in operation 714, the symbol corresponding to this erasure coefficient $w_i$, is added to the erasure list E, e.g., $E=E\cup\{w_i\}$.

In operation 716, it is determined whether the number of symbols in the erasure list E is equal to the number of symbols to erase L. In response to a determination that the number of symbols in the erasure list E is equal to the number of symbols to erase L, method 700 continues to operation 718; otherwise, method 700 returns to operation 708 so that more symbols may be added to the erasure list E.

In operation 718, C2 decoding is performed on the codeword using erasure pointers associated with erasure coefficients from the erasure list E, such that the symbols corresponding to the entries in the erasure list E are erased during C2 error-and-erasure decoding.

According to method 700, a predetermined number of symbols may be added to the erasure list, E, and sent for C2 error-and-erasure decoding using the erasure pointers provided by the C1 decoder. The symbols selected will all be associated with the highest erasure coefficients, and therefore are the most probable candidates to be erased in C2 decoding, as the confidence in the decoded symbol is lowest for these symbols.

Figure 8:
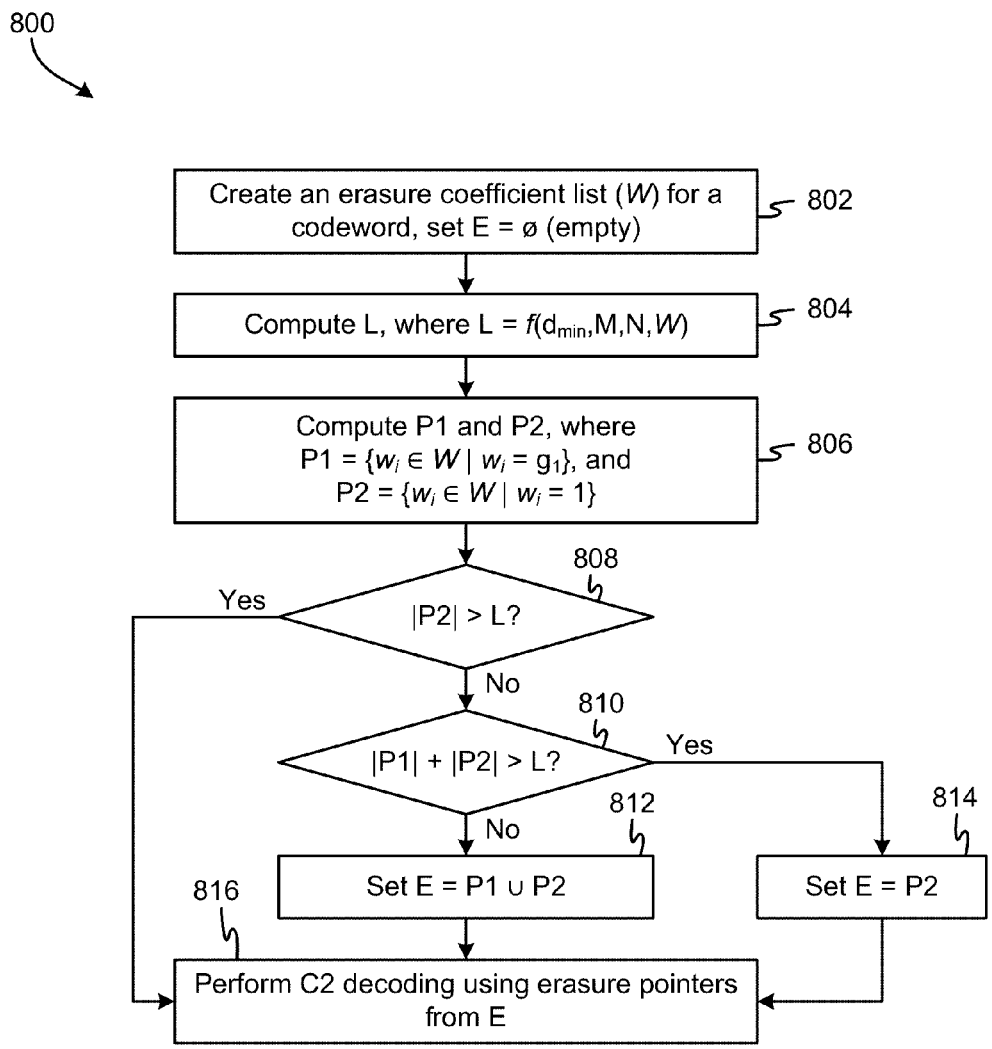
FIG. 8 shows a flowchart of a method, according to one embodiment.

Now referring to FIG. 8, a method 800 is shown according to one embodiment. The method 800 may be performed in accordance with the present invention in any of the environments depicted in FIGS. 1-6, among others, in various embodiments. Of course, more or less operations than those specifically described in FIG. 8 may be included in method 800, as would be understood by one of skill in the art upon reading the present descriptions.

Each of the steps of the method 800 may be performed by any suitable component of the operating environment. For example, in various embodiments, the method 800 may be partially or entirely performed by a controller, a processor, a tape drive, or some other device having one or more processors therein. The processor, e.g., processing circuit(s), chip(s), and/or module(s) implemented in hardware and/or software, and preferably having at least one hardware component, may be utilized in any device to perform one or more steps of the method 800. Illustrative processors include, but are not limited to, a CPU, an ASIC, a FPGA, etc., combinations thereof, or any other suitable computing device known in the art.

In method 800, W is the erasure list comprising the erasure coefficients corresponding to all symbols in a C2 codeword generated by track-dependent erasure coefficient logic, with a C2 code being a (N,K) RS code, |W|=N, E is the erasure list of symbols to erase, |E|=number of entries in E, M is the minimum margin reserved for correcting at least floor(M/2) symbols, and the erasure coefficients are three-level quantized such that $w_i \in \{0, g_1, 1\}$. In this embodiment, the list of all coefficients W is partitioned into three mutually exclusive sets: P0, P1 and P2, where $W = P0 \cup P1 \cup P2$.

According to one embodiment, P0 is the set of all erasure coefficients $w_i$ having an erasure coefficient of zero indicating no erasure flag being raised by the C1 decoder (C1 decoding success), e.g., $P0 = \{w_i \in W | w_i = 0\}$, P1 is the set of all erasure coefficients $w_i$, that correspond to a case where the C1 decoder has raised an erasure flag (a C1 decoding failure), e.g., $\{w_i \in W | w_i = g_1\}$, and P2 is the set of all erasure coefficients $w_i$ having an erasure coefficient of one indicating either an erasure flag is raised by the RLL decoder or no decoded C1 codeword is provided by the C1 decoder, e.g., $P2 = \{w_i \in W | w_i = 1\}$.

As shown in FIG. 8, method 800 may initiate with operation 802, where an erasure coefficient list, W, is created having the erasure coefficients for all decoded symbols of a codeword. Also, the erasure list, E, is set to empty. This erasure list will be populated during the method 800.

In operation 804, a number of symbols of the codeword to erase, L, is computed based on minimum Hamming distance, $d_{min}$, a length of the codeword, N, a minimum margin, M, reserved for correcting at least floor(M/2) symbols of the codeword, and the erasure coefficient list (W), where $L = f(d_{min}, M, N, W)$.

In one embodiment, $L = D + H = D + floor((F-D) B/(A+B))$. The maximum number of erased symbols, F, is equal to $d_{min} - 1 - M$, and the term D is defined as $D = \min\{F, N-m\}$ where D is the total number of symbols in a C1 codeword that have erasure coefficient 1. We assumed that D is less than or equal to F. If D>F, then the decoder either declares decoding failure or attempts to correct F or more erased bytes by accepting the risk of higher probability of miscorrection. The maximum number of erased bytes that may be corrected is $F + M = d_{min} - 1$. Furthermore, the sum of the terms A+B is the sum of the coefficients in the third erasure coefficient list W" where the value of the coefficients are between 0 and 1, e.g., $0 < w_i < 1$, with $A + B = \sum_{i=j}^{m} w_i$, with B being the sum of the coefficients in the area defined by F where the value of the coefficients are not equal to 1, e.g., $w_i \neq 1$, where $B = \sum_{i=N-F+1}^{N-D} w_i$.

In operation 806, P1 and P2 are computed, where P1 includes all erasure coefficients (and associated symbols) that correspond to a situation where the C1 decoder has raised an erasure flag (a C1 decoding failure), e.g., $\{w_i \in W | w_i = g_1\}$. Also, P2 includes the set of all erasure coefficients $w_i$ having an erasure coefficient of one indicating either an erasure flag is raised by the RLL decoder or no decoded C1 codeword is provided by the C1 decoder, e.g., $P2 = \{w_i \in W | w_i = 1\}$.

In operation 808, it is determined whether the number of symbols in P2 is greater than the number of symbols to erase L. In response to a determination that the number of symbols in P2 is greater than the number of symbols to erase L, method 800 jumps to operation 816; otherwise, method 800 continues to operation 810.

In operation 810, it is determined whether the sum of the number of symbols in P1 and P2 is greater than the number of symbols to erase L. In response to a determination that the sum of the number of symbols in P1 and P2 is greater than the number of symbols to erase L, method 800 jumps to operation 814; otherwise, method 800 continues to operation 812.

In operation 812, the erasure list E is set to be the union of P1 and P2.

In operation 814, the erasure list E is set to be P2.

The present invention may be a system, a method, and/or a computer program product. The computer program product may include a computer readable storage medium (or media) having computer readable program instructions thereon for causing a processor to carry out aspects of the present invention.

In operation 816, C2 decoding is performed on the codeword using erasure pointers associated with erasure coefficients from the erasure list E, such that the symbols corresponding to the entries in the erasure list E are erased during C2 error-and-erasure decoding.

In an alternate embodiment of method 800, exactly L symbols may be erased, the L symbols having the highest corresponding erasure coefficients in the erasure coefficient list W.

Figure 9:
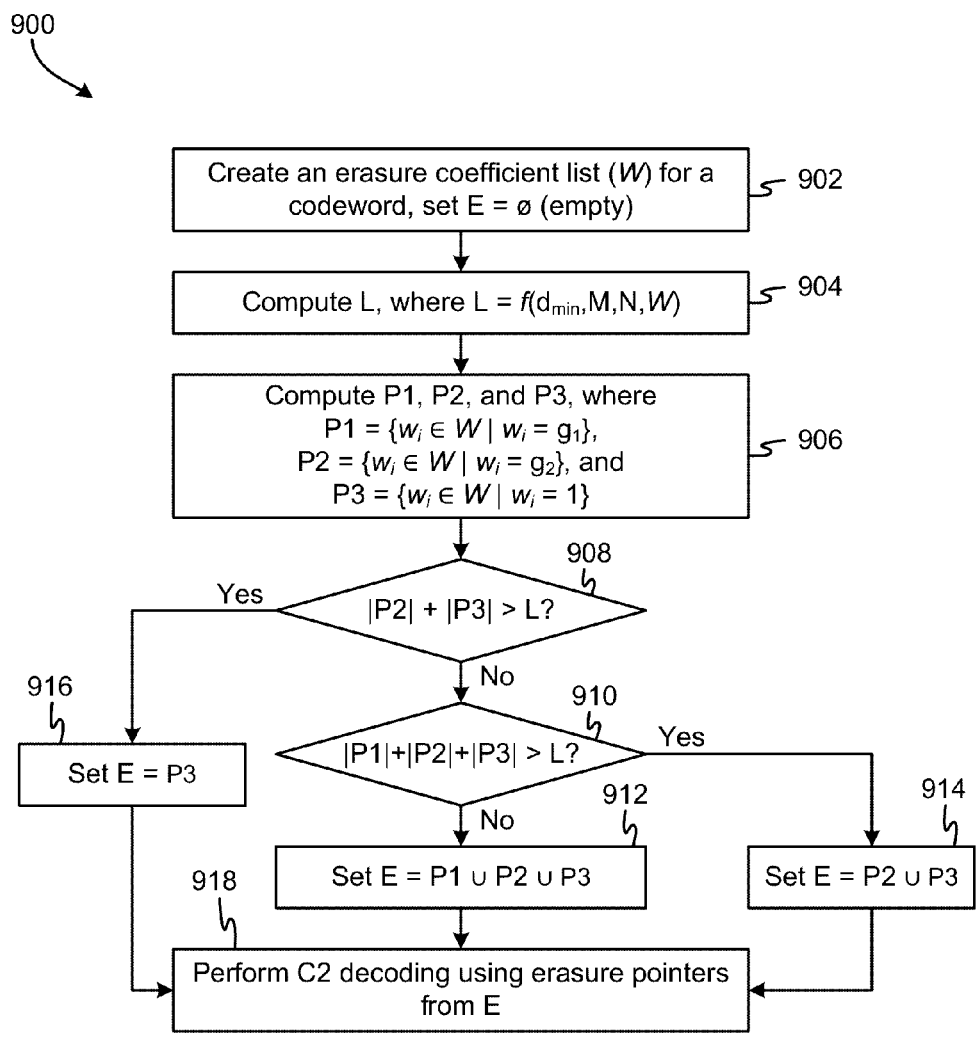
FIG. 9 shows a flowchart of a method, according to one embodiment.

Now referring to FIG. 9, a method 900 is shown according to one embodiment. The method 900 may be performed in accordance with the present invention in any of the environments depicted in FIGS. 1-6, among others, in various embodiments. Of course, more or less operations than those specifically described in FIG. 9 may be included in method 900, as would be understood by one of skill in the art upon reading the present descriptions.

Each of the steps of the method 900 may be performed by any suitable component of the operating environment. For example, in various embodiments, the method 900 may be partially or entirely performed by a controller, a processor, a tape drive, or some other device having one or more processors therein. The processor, e.g., processing circuit(s), chip(s), and/or module(s) implemented in hardware and/or software, and preferably having at least one hardware component, may be utilized in any device to perform one or more steps of the method 900. Illustrative processors include, but are not limited to, a CPU, an ASIC, a FPGA, etc., combinations thereof, or any other suitable computing device known in the art.

In method 900, W is the erasure list comprising the erasure coefficients corresponding to all symbols in a C2 codeword generated by track-dependent erasure coefficient logic, with a C2 code being a (N,K) RS code, |W|=N, E is the erasure list of symbols to erase, |E|=number of entries in E, M is the minimum margin reserved for correcting at least floor(M/2) symbols, and the erasure coefficients are four-level quantized such that $w_i \in \{0, g_1, g_2, 1\}$. In this embodiment, the list of all coefficients W is partitioned into four mutually exclusive sets: P0, P1 P2, and P3 where $W = P0 \cup P1 \cup P2 \cup P3$.

According to one embodiment, P0 is the set of all erasure coefficients $w_i$ having an erasure coefficient of zero indicating no erasure flag being raised by the C1 decoder (C1 decoding success), e.g., $P0 = \{w_i \in W | w_i = 0\}$, P1 is the set of all erasure coefficients $w_i$ that correspond to a case where the C1 decoder has raised an erasure flag (a C1 decoding failure), e.g., $\{w_i \in W | w_i = g_1\}$, P2 is the set of all erasure coefficients $w_i$ that correspond to a case where the RLL decoder has raised an erasure flag (a RLL decoding failure), e.g., $\{w_i \in W | w_i = g_2\}$, and P3 is the set of all erasure coefficients $w_i$ having an erasure coefficient of one indicating no decoded C1 codeword is provided by the C1 decoder, e.g., $P3 = \{w_i \in W | w_i = 1\}$.

As shown in FIG. 9, method 900 may initiate with operation 902, where an erasure coefficient list, W, is created having the erasure coefficients for all decoded symbols of a codeword. Also, the erasure list, E, is set to empty. This erasure list will be populated during the method 900.

In operation 904, a number of symbols of the codeword to erase, L, is computed based on minimum Hamming distance, $d_{min}$, a length of the codeword, N, a minimum margin, M, reserved for correcting at least floor(M/2) symbols of the codeword, and the erasure coefficient list (W), where $L=f(d_{min},M,N,W)$.

In one embodiment, L=D+H=D+floor((F−D) B/(A+B)). The maximum number of erased symbols, F, is equal to $d_{min}-1-M$, and the term D is defined as D=min{F, N−m} where D is the total number of symbols in a C1 codeword that have erasure coefficient 1. We assumed that D is less than or equal to F. If D>F, then the decoder either declares decoding failure or attempts to correct F or more erased bytes by accepting the risk of higher probability of miscorrection. The maximum number of erased bytes that may be corrected is $F+M=d_{min}-1$. Furthermore, the sum of the terms A+B is the sum of the coefficients in the third erasure coefficient list W" where the value of the coefficients are between 0 and 1, e.g., $0<w_i<1$, with $A+B=\Sigma_{i=j}^{m}w_i$, with B being the sum of the coefficients in the area defined by F where the value of the coefficients are not equal to 1, e.g., $w_i \neq 1$, where $B=\Sigma_{i=N-F+1}^{N-D}w_i$.

In operation 906, P1, P2, and P3 are computed, where P1 includes all erasure coefficients (and associated symbols) that correspond to a situation where the C1 decoder has raised an erasure flag (a C1 decoding failure), e.g., $\{w_i \epsilon W | w_i = g_1\}$. Also, P2 includes the set of all erasure coefficients $w_i$ that correspond to a case where the RLL decoder has raised an erasure flag (a RLL decoding failure), e.g., $\{w_i \epsilon W | w_i = g_2\}$. Moreover, P3 includes the set of all erasure coefficients having an erasure coefficient of one indicating no decoded C1 codeword is provided by the C1 decoder, e.g., $P3=\{w_i \epsilon W | w_i = 1\}$.

In operation 908, it is determined whether the sum of the number of symbols in P2 and P3 is greater than the number of symbols to erase L. In response to a determination that the sum of the number of symbols in P2 and P3 is greater than the number of symbols to erase L, method 900 jumps to operation 916; otherwise, method 900 continues to operation 910.

In operation 910, it is determined whether the sum of the number of symbols in P1, P2, and P3 is greater than the number of symbols to erase L. In response to a determination that the sum of the number of symbols in P1, P2, and P3 is greater than the number of symbols to erase L, method 900 jumps to operation 914; otherwise, method 900 continues to operation 912.

In operation 912, the erasure list E is set to be the union of P1, P2, and P3.

In operation 914, the erasure list E is set to be the union of P2 and P3.

In operation 916, the erasure list E is set to be P3.

In operation 918, C2 decoding is performed on the codeword using erasure pointers associated with erasure coefficients from the erasure list E, such that the symbols corresponding to the entries in the erasure list E are erased during C2 error-and-erasure decoding.

In an alternate embodiment of method 900, exactly L symbols may be erased, the L symbols having the highest corresponding erasure coefficients in the erasure coefficient list W.

Figure 10:
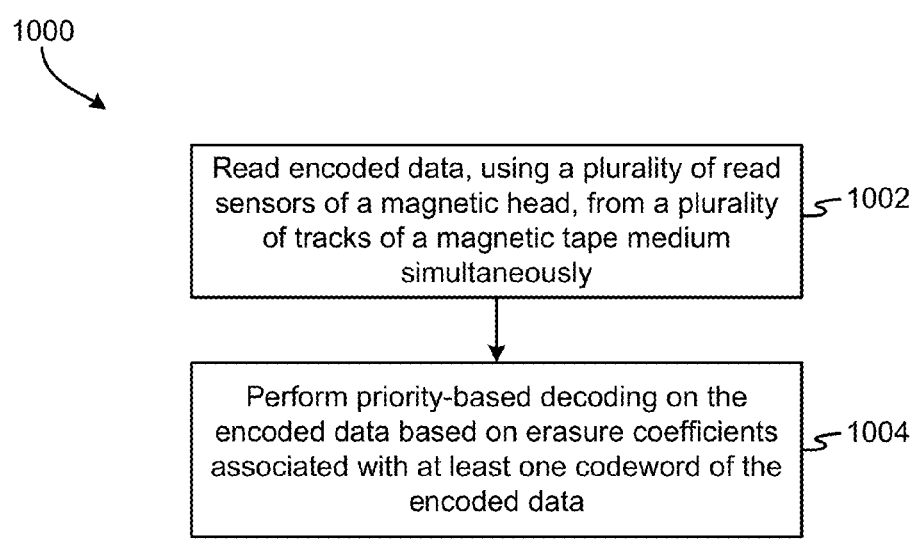
FIG. 10 shows a flowchart of a method, according to one embodiment.

Now referring to FIG. 10, a method 1000 is shown according to one embodiment. The method 1000 may be performed in accordance with the present invention in any of the environments depicted in FIGS. 1-6, among others, in various embodiments. Of course, more or less operations than those specifically described in FIG. 10 may be included in method 1000, as would be understood by one of skill in the art upon reading the present descriptions.

Each of the steps of the method 1000 may be performed by any suitable component of the operating environment. For example, in various embodiments, the method 1000 may be partially or entirely performed by a controller, a processor, a tape drive, or some other device having one or more processors therein. The processor, e.g., processing circuit(s), chip(s), and/or module(s) implemented in hardware and/or software, and preferably having at least one hardware component, may be utilized in any device to perform one or more steps of the method 1000. Illustrative processors include, but are not limited to, a CPU, an ASIC, a FPGA, etc., combinations thereof, or any other suitable computing device known in the art.

As shown in FIG. 10, method 1000 may initiate with operation 1002, where encoded data read from a plurality of tracks of a magnetic tape medium simultaneously is received, such as by track-dependent erasure coefficient logic of a tape drive, or some other suitable component or device.

In operation 1004, priority-based decoding is performed on the encoded data based on erasure coefficients associated with at least one codeword of the encoded data.

Any of the embodiments described previously, particularly in FIGS. 7-9 may be used for performing the priority-based decoding. In on embodiment, performing the priority-based decoding may include calculating an erasure coefficient for each symbol in the at least one codeword, each erasure coefficient being a measure of a reliability of an associated decoded symbol in the at least one codeword, generating an erasure coefficient list comprising the erasure coefficients associated with each symbol of the at least one codeword, generating an erasure list comprising a subset of symbols from the at least one codeword based on the erasure coefficient list, and performing error-and-erasure C2 decoding using erasure pointers corresponding to the subset of symbols in the erasure list.

In this embodiment, the erasure list may include a predetermined number of symbols having erasure coefficients not lower than erasure coefficients of symbols not selected for the erasure list, where a lower erasure coefficient indicates smaller confidence that an associated symbol is to be erased.

In another embodiment, performing priority-based decoding may include computing the predetermined number of symbols in the erasure list as a function of minimum Hamming distance, a length of the at least one codeword, a minimum margin reserved for correcting an integer number of bytes at least half the minimum margin, and the erasure coefficient list.

In a further embodiment, any symbols having a corresponding erasure coefficient equal to zero may be excluded from the erasure list.

In another embodiment, the erasure coefficients in the erasure coefficient list may be quantized into at least three levels, e.g., P0, P1, P2, etc. In one embodiment, the at least three levels may include a first level (P0) having all erasure coefficients equal to zero, a second level (P1) having all erasure coefficients where an erasure flag is raised by a C1 decoder, and a third level (P2) having all erasure coefficients equal to one. In this embodiment, the erasure list includes symbols of the at least one codeword corresponding to erasure coefficients in the second and third levels in response to a determination that a number of symbols corresponding to erasure coefficients in the second and third levels does not exceed a predetermined number of symbols. Moreover, the erasure list includes symbols of the at least one codeword corresponding to erasure coefficients in the third level in response to a determination that a number of symbols corresponding to erasure coefficients in the second and third levels exceed the predetermined number of symbols.

According to another embodiment, the at least three levels may include a first level (P0) having all erasure coefficients equal to zero, a second level (P1) having all erasure coefficients where an erasure flag is raised by a C1 decoder, a third level (P2) having all erasure coefficients where an erasure flag is raised by a RLL decoder, and a fourth level (P3) having all erasure coefficients equal to one. In this embodiment, the erasure list includes symbols of the at least one codeword corresponding to erasure coefficients in the second, third, and fourth levels in response to a determination that a number of symbols corresponding to erasure coefficients in the second, third, and fourth levels does not exceed a predetermined number of symbols. Moreover, the erasure list includes symbols of the at least one codeword corresponding to erasure coefficients in the third and fourth levels in response to a determination that the number of symbols corresponding to erasure coefficients in the second, third, and fourth levels exceed the predetermined number of symbols and a number of symbols corresponding to erasure coefficients in the third and fourth levels does not exceed the predetermined number of symbols. Furthermore, the erasure list includes symbols of the at least one codeword corresponding to erasure coefficients in the fourth level in response to a determination that a number of symbols corresponding to erasure coefficients in the third and fourth levels exceed the predetermined number of symbols.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an ASIC, a FPGA, etc. By executable by the processor, what is meant is that the logic is hardware logic, software logic such as firmware, part of an operating system, part of an application program, etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a CPU, an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A tape drive, comprising:
a magnetic head having a plurality of read sensors, each read sensor being configured to read a portion of encoded data from one of a plurality of tracks of a magnetic tape medium simultaneously in parallel with all other read sensors of the plurality of read sensors; and
a controller and logic integrated with and/or executable by the controller, the logic being configured to cause the controller to:
receive the encoded data from the plurality of read sensors, each portion of the encoded data being read from the plurality of tracks of the magnetic tape medium simultaneously; and
perform priority-based decoding on the encoded data based on erasure coefficients associated with at least one codeword of the encoded data, the logic configured to cause the controller to perform priority-based decoding further causing the controller to:
calculate an erasure coefficient for each symbol in the at least one codeword, each erasure coefficient being a measure of a reliability of an associated decoded symbol in the at least one codeword;
generate an erasure coefficient list comprising the erasure coefficients associated with each symbol of the at least one codeword;
quantize the erasure coefficients in the erasure coefficient list into at least three levels;
generate an erasure list comprising a subset of symbols from the at least one codeword based on the erasure coefficient list; and
perform error-and-erasure C2 decoding using erasure pointers corresponding to the subset of symbols in the erasure list.

2. The tape drive as recited in claim 1, wherein the logic is further configured to compute a number of symbols of each of the at least one codeword to erase (L) based on minimum Hamming distance ($d_{min}$), a length of the at least one codeword (N), a minimum margin (M) reserved for correcting at least floor(M/2) symbols of the at least one codeword, a total number of symbols in a C1 codeword that have erasure coefficients having a value of 1 (D), a maximum number of erased symbols (F), a sum of erasure coefficients in an area defined by F where values of the erasure coefficients are not equal to 1 (B), a sum of all erasure coefficients that have a value between 0 and 1 (A+B), and the erasure coefficient list (W), where L=D+floor(($d_{min}$−1−M−D)*B/(A+B)).

3. The tape drive as recited in claim 1, wherein the erasure list comprises a predetermined number of symbols having erasure coefficients that have values that are higher than values for erasure coefficients of symbols not selected for the erasure list, wherein a lower erasure coefficient indicates smaller confidence that an associated symbol is to be erased.

4. The tape drive as recited in claim 3, wherein the logic configured to perform priority-based decoding is further configured to compute the predetermined number of symbols in the erasure list as a function of minimum Hamming distance, a length of the at least one codeword, a minimum margin reserved for correcting an integer number of bytes at least half the minimum margin, and the erasure coefficient list.

5. The tape drive as recited in claim 1, wherein the logic configured to perform priority-based decoding is further configured to exclude any symbols having a corresponding erasure coefficient equal to zero from the erasure coefficient list.

6. The tape drive as recited in claim 1, wherein the at least three levels comprise a first level having all erasure coefficients equal to zero, a second level having all erasure coefficients where an erasure flag is raised by a C1 decoder, and a third level having all erasure coefficients equal to one.

7. The tape drive as recited in claim 6,
wherein the erasure list includes symbols of the at least one codeword corresponding to erasure coefficients in the second and third levels in response to a determination that a number of symbols corresponding to erasure coefficients in the second and third levels does not exceed a predetermined number of symbols, and
wherein the erasure list includes symbols of the at least one codeword corresponding to erasure coefficients in the third level in response to a determination that a number of symbols corresponding to erasure coefficients in the second and third levels exceed the predetermined number of symbols.

8. The tape drive as recited in claim 1,
wherein the at least three levels comprise a first level having all erasure coefficients equal to zero, a second level having all erasure coefficients where an erasure flag is raised by a C1 decoder, a third level having all erasure coefficients where an erasure flag is raised by a run-length-limited (RLL) decoder, and a fourth level having all erasure coefficients equal to one,
wherein the erasure list includes symbols of the at least one codeword corresponding to erasure coefficients in the second, third, and fourth levels in response to a determination that a number of symbols corresponding to erasure coefficients in the second, third, and fourth levels does not exceed a predetermined number of symbols,
wherein the erasure list includes symbols of the at least one codeword corresponding to erasure coefficients in the third and fourth levels in response to a determination that the number of symbols corresponding to erasure coefficients in the second, third, and fourth levels exceed the predetermined number of symbols and a number of symbols corresponding to erasure coefficients in the third and fourth levels does not exceed the predetermined number of symbols, and
wherein the erasure list includes symbols of the at least one codeword corresponding to erasure coefficients in the fourth level in response to a determination that a number of symbols corresponding to erasure coefficients in the third and fourth levels exceed the predetermined number of symbols.

9. A controller-implemented method, the method comprising:
receiving encoded data read from a plurality of read sensors, each portion of the encoded data being read from a plurality of tracks of a magnetic tape medium simultaneously; and
performing priority-based decoding on the encoded data based on erasure coefficients associated with at least one codeword of the encoded data by:
calculating an erasure coefficient for each symbol in the at least one codeword, each erasure coefficient being a measure of a reliability of an associated decoded symbol in the at least one codeword;
generating an erasure coefficient list comprising the erasure coefficients associated with each symbol of the at least one codeword;
quantizing the erasure coefficients in the erasure coefficient list into at least three levels;
generating an erasure list comprising a subset of symbols from the at least one codeword based on the erasure coefficient list; and
performing error-and-erasure C2 decoding using erasure pointers corresponding to the subset of symbols in the erasure list.

10. The method as recited in claim 9, further comprising computing a number of symbols of each of the at least one codeword to erase (L) based on minimum Hamming distance ($d_{min}$), a length of the at least one codeword (N), a minimum margin (M) reserved for correcting at least floor (M/2) symbols of the at least one codeword, a total number of symbols in a C1 codeword that have erasure coefficients having a value of 1 (D), a maximum number of erased symbols (F), a sum of erasure coefficients in an area defined by F where values of the erasure coefficients are not equal to 1 (B), a sum of all erasure coefficients that have a value between 0 and 1 (A+B), and the erasure coefficient list (W), where $L=D+\text{floor}((d_{min}-1-M-D)*B/(A+B))$.

11. The method as recited in claim 9, wherein the erasure list comprises a predetermined number of symbols having erasure coefficients that have values that are higher than values for erasure coefficients of symbols not selected for the erasure list, wherein a lower erasure coefficient indicates smaller confidence that an associated symbol is to be erased.

12. The method as recited in claim 11, wherein the performing priority-based decoding further comprises computing the predetermined number of symbols in the erasure list as a function of minimum Hamming distance, a length of the at least one codeword, a minimum margin reserved for correcting an integer number of bytes at least half the minimum margin, and the erasure coefficient list.

13. The method as recited in claim 9, wherein the performing priority-based decoding further comprises excluding any symbols having a corresponding erasure coefficient equal to zero from the erasure coefficient list.

14. The method as recited in claim 10, wherein the at least three levels comprise a first level having all erasure coefficients equal to zero, a second level having all erasure coefficients where an erasure flag is raised by a C1 decoder, and a third level having all erasure coefficients equal to one.

15. The method as recited in claim 14,
wherein the erasure list includes symbols of the at least one codeword corresponding to erasure coefficients in the second and third levels in response to a determination that a number of symbols corresponding to erasure coefficients in the second and third levels does not exceed a predetermined number of symbols, and
wherein the erasure list includes symbols of the at least one codeword corresponding to erasure coefficients in the third level in response to a determination that a number of symbols corresponding to erasure coefficients in the second and third levels exceed the predetermined number of symbols.

16. The method as recited in claim 9,
wherein the at least three levels comprise a first level having all erasure coefficients equal to zero, a second level having all erasure coefficients where an erasure flag is raised by a C1 decoder, a third level having all erasure coefficients where an erasure flag is raised by a run-length-limited (RLL) decoder, and a fourth level having all erasure coefficients equal to one,
wherein the erasure list includes symbols of the at least one codeword corresponding to erasure coefficients in the second, third, and fourth levels in response to a determination that a number of symbols corresponding to erasure coefficients in the second, third, and fourth levels does not exceed a predetermined number of symbols, wherein the erasure list includes symbols of the at least one codeword corresponding to erasure coefficients in the third and fourth levels in response to a determination that the number of symbols corresponding to erasure coefficients in the second, third, and fourth levels exceed the predetermined number of symbols and a number of symbols corresponding to erasure coefficients in the third and fourth levels does not exceed the predetermined number of symbols, and wherein the erasure list includes symbols of the at least one codeword corresponding to erasure coefficients in the fourth level in response to a determination that a number of symbols corresponding to erasure coefficients in the third and fourth levels exceed the predetermined number of symbols.

17. A computer program product, the computer program product comprising a computer readable storage medium having program instructions embodied therewith, the embodied program instructions being executable by a controller to cause the controller to:

receive, by the controller, encoded data from a plurality of read sensors, each portion of the encoded data being read from a plurality of tracks of a magnetic tape medium simultaneously; and perform, by the controller, priority-based decoding on the encoded data based on erasure coefficients associated with at least one codeword of the encoded data, the embodied program instructions being further executable to cause the controller to:

calculate an erasure coefficient for each symbol in the at least one codeword, each erasure coefficient being a measure of a reliability of an associated decoded symbol in the at least one codeword;

generate an erasure coefficient list comprising the erasure coefficients associated with each symbol of the at least one codeword;

quantize the erasure coefficients in the erasure coefficient list into at least three levels;

generate an erasure list comprising a subset of symbols from the at least one codeword based on the erasure coefficient list; and perform error-and-erasure C2 decoding using erasure pointers corresponding to the subset of symbols in the erasure list.

18. The computer program product as recited in claim 17, wherein the embodied program instructions are further executable by the controller to cause the controller to compute a number of symbols of each of the at least one codeword to erase (L) based on minimum Hamming distance ($d_{min}$), a length of the at least one codeword (N), a minimum margin (M) reserved for correcting at least floor (M/2) symbols of the at least one codeword, a total number of symbols in a C1 codeword that have erasure coefficients having a value of 1 (D), a maximum number of erased symbols (F), a sum of erasure coefficients in an area defined by F where values of the erasure coefficients are not equal to 1 (B), a sum of all erasure coefficients that have a value between 0 and 1 (A+B), and the erasure coefficient list (W), where L=D+floor(($d_{min}$−1−M−D)*B/(A+B)).

19. The computer program product as recited in claim 18, wherein the erasure list comprises a predetermined number of symbols having erasure coefficients that have values that are higher than values for erasure coefficients of symbols not selected for the erasure list, wherein a lower erasure coefficient indicates smaller confidence that an associated symbol is to be erased.

20. The computer program product as recited in claim 19, wherein the embodied program instructions executable by the controller to cause the controller to perform priority-based decoding on the encoded data further cause the controller to compute, by the controller, the predetermined number of symbols in the erasure list as a function of minimum Hamming distance, a length of the at least one codeword, a minimum margin reserved for correcting an integer number of bytes at least half the minimum margin, and the erasure coefficient list.

21. The computer program product as recited in claim 17, wherein the embodied program instructions executable by the controller to cause the controller to perform priority-based decoding on the encoded data further cause the controller to exclude, by the controller, any symbols having a corresponding erasure coefficient equal to zero from the erasure coefficient list.

22. The computer program product as recited in claim 17, wherein the at least three levels comprise a first level having all erasure coefficients equal to zero, a second level having all erasure coefficients where an erasure flag is raised by a C1 decoder, and a third level having all erasure coefficients equal to one.

23. The computer program product as recited in claim 22, wherein the erasure list includes symbols of the at least one codeword corresponding to erasure coefficients in the second and third levels in response to a determination that a number of symbols corresponding to erasure coefficients in the second and third levels does not exceed a predetermined number of symbols, and wherein the erasure list includes symbols of the at least one codeword corresponding to erasure coefficients in the third level in response to a determination that a number of symbols corresponding to erasure coefficients in the second and third levels exceed the predetermined number of symbols.

24. The computer program product as recited in claim 17, wherein the at least three levels comprise a first level having all erasure coefficients equal to zero, a second level having all erasure coefficients where an erasure flag is raised by a C1 decoder, a third level having all erasure coefficients where an erasure flag is raised by a run-length-limited (RLL) decoder, and a fourth level having all erasure coefficients equal to one, wherein the erasure list includes symbols of the at least one codeword corresponding to erasure coefficients in the second, third, and fourth levels in response to a determination that a number of symbols corresponding to erasure coefficients in the second, third, and fourth levels does not exceed a predetermined number of symbols, wherein the erasure list includes symbols of the at least one codeword corresponding to erasure coefficients in the third and fourth levels in response to a determination that the number of symbols corresponding to erasure coefficients in the second, third, and fourth levels exceed the predetermined number of symbols and a number of symbols corresponding to erasure coefficients in the third and fourth levels does not exceed the predetermined number of symbols, and wherein the erasure list includes symbols of the at least one codeword corresponding to erasure coefficients in the fourth level in response to a determination that a number of symbols corresponding to erasure coefficients in the third and fourth levels exceed the predetermined number of symbols.

* * * * *